United States Patent
Ryzhikov et al.

(10) Patent No.: US 7,227,613 B2
(45) Date of Patent: Jun. 5, 2007

(54) LITHOGRAPHIC APPARATUS HAVING DOUBLE TELECENTRIC ILLUMINATION

(75) Inventors: Lev Ryzhikov, Norwalk, CT (US); Yuli Vladimirsky, Weston, CT (US)

(73) Assignee: ASML Holding N.V., Veldhoven (NL)

( * ) Notice: Subject to any disclaimer, the term of this patent is extended or adjusted under 35 U.S.C. 154(b) by 85 days.

(21) Appl. No.: 10/898,290

(22) Filed: Jul. 26, 2004

(65) Prior Publication Data

US 2006/0017902 A1 Jan. 26, 2006

(51) Int. Cl.
G03B 27/42 (2006.01)

(52) U.S. Cl. ....................................................... 355/53

(58) Field of Classification Search ................ 355/53, 355/67, 77; 345/690, 694
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,382,999 A * | 1/1995 | Kamon ........................ | 355/53 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2003/0058419 A1* | 3/2003 | Roddy et al. ................. | 355/32 |
| 2004/0041104 A1 | 3/2004 | Liebregts et al. | |
| 2004/0057120 A1* | 3/2004 | Olszak et al. ................ | 359/619 |
| 2004/0130561 A1 | 7/2004 | Jain | |
| 2004/0179270 A1 | 9/2004 | Coston et al. | |
| 2004/0239909 A1* | 12/2004 | Bleeker et al. ............... | 355/67 |
| 2005/0007572 A1 | 1/2005 | George et al. | |
| 2006/0001847 A1* | 1/2006 | De Jager et al. ............. | 355/30 |

FOREIGN PATENT DOCUMENTS

| WO | WO 98/33096 | 7/1998 |
|---|---|---|
| WO | WO 98/38597 | 9/1998 |

* cited by examiner

*Primary Examiner*—Henry Hung Nguyen
*Assistant Examiner*—Marissa A. Ohira
(74) *Attorney, Agent, or Firm*—Sterne, Kessler, Goldstein & Fox, P.L.L.C.

(57) ABSTRACT

A system and method are used to pattern illumination to form one or more devices on a substrate using a reflecting system, a pattern generator that defines an objection plane, a projection system, and the substrate that defines an image plane. A reflecting portion of the reflecting system is substantially parallel to a reflecting portion of the pattern generator. The reflecting portion of the pattern generator patterns the illumination beam and directs the patterned illumination beam towards the substrate via the projection system. Based on the relationship of the reflecting system and the pattern generator, the illumination beam is telecentric proximate the object plane and the patterned illumination beam is telecentric proximate the image plane. Through use of a reflecting optic and not a transmissive optic to direct light between the illuminator and the projection system, illumination efficiency is increased and errors imparted on the illumination are decreased.

19 Claims, 8 Drawing Sheets

LITHOGRAPHIC APPARATUS HAVING DOUBLE TELECENTRIC ILLUMINATION

BACKGROUND OF THE INVENTION

1. Field of the Invention

The present invention is related to a lithography system.

2. Background Art

In lithography systems, pattern generators are used to pattern substrates during an exposure process. Example lithography systems include, but are not limited to, reflective or transmissive maskless, immersion, and mask-based system. Example substrates include, but are not limited to, semiconductor wafers, flat panel display substrates, flexible substrates, and the like. Light interacting with an illumination spot on the pattern generator becomes patterned. The patterned light is projected using a projection optical system onto one or more target areas of the substrate during the exposure process to form features on a photosensitive material (e.g., a photoresist) on the substrate.

In some applications of the lithography system, it is desired to have double telecentric illumination, which means that a chief ray of an illumination beam is telecentric in both object space and image space. Object space is proximate an object plane, typically defined by the pattern generator. Image space is proximate an image plane, typically defined by the substrate. Conventional systems having double telecentric illumination generally use a transmissive optic to direct the illumination from an illuminator towards the pattern generator and from the pattern generator towards a projection optical system. However, transmissive optics tend to absorb illumination, and thus can have low efficiency. For example, a typical transmissive optic can sometimes transmit as little as about 20–25% of the light between the illuminator and the projection system. Also, transmissive optics can cause polarization, aberration, distortion, birefringence, and other errors in the illumination, which sometimes requires complex optics to correct.

Therefore, what is needed is a system and method that can be used to provide a double telecentric system, which eliminates or substantially reduces absorption of illumination and/or that eliminates or substantially reduces polarization change, birefringence, aberration, distortion, and/or other errors being introduced in the illumination beam.

BRIEF SUMMARY OF THE INVENTION

An embodiment of the present invention provides a system, comprising an illumination system that generates an illumination beam of radiation, a reflecting system, a pattern generator defining an objection plane, a projection system, and a substrate defining an image plane. A reflecting portion of the reflecting system is substantially parallel to a reflecting portion of the pattern generator when reflecting portion of the pattern generator is in a default state. The reflecting portion of the pattern generator patterns the illumination beam and directs the patterned illumination beam to the substrate via the projection system, such that the illumination beam is telecentric proximate the object plane and the patterned illumination beam is telecentric proximate the image plane.

Another embodiment of the present invention provides a lithography system comprising an illuminating system that produces an illumination beam, a dynamic pattern generator having a plurality of reflective controllable elements that patterns the illumination beam, a reflector having a conical reflecting surface that is substantially parallel to respective reflecting surfaces of the plurality of reflective controllable elements in a default state, and a projection system that directs the patterned illumination beam onto a substrate. The illumination beam is telecentric proximate an object plane and the patterned illumination beam is telecentric proximate an image plane.

A further embodiment of the present invention provides a lithography system, comprising an illuminating system that produces an illumination beam, a dynamic pattern generator having a plurality of reflective controllable elements that patterns the illumination beam, first and second reflectors whose respective reflecting surfaces are substantially parallel to reflecting surfaces of the plurality of reflective controllable elements in a default state, and a projection system that directs the patterned illumination beam onto a substrate. The illumination beam is telecentric at an object plane and the patterned illumination beam is telecentric at an image plane.

A still further embodiment of the present invention provides a method of making a device comprising the steps of (a) reflecting an illumination beam from a reflecting system towards a pattern generator that defines an object plane, (b) patterning the illumination beam using the pattern generator, (c) directing the patterned illumination beam using a projection system onto a substrate that defines an image plane and on which the device is formed, and (d) positioning a reflecting portion of the reflecting system substantially parallel to a reflecting portion of the pattern generator when the pattern generator is in a default state, the reflecting portion of the pattern generator patterning the illumination beam and directing the patterned illumination beam to the substrate, such that the illumination beam is telecentric proximate the object plane and the patterned illumination beam is telecentric proximate the image plane Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate various embodiments of the present invention and, together with the description, further serve to explain the principles of the invention and to enable a person skilled in the pertinent art to make and use the invention.

Figure 1:
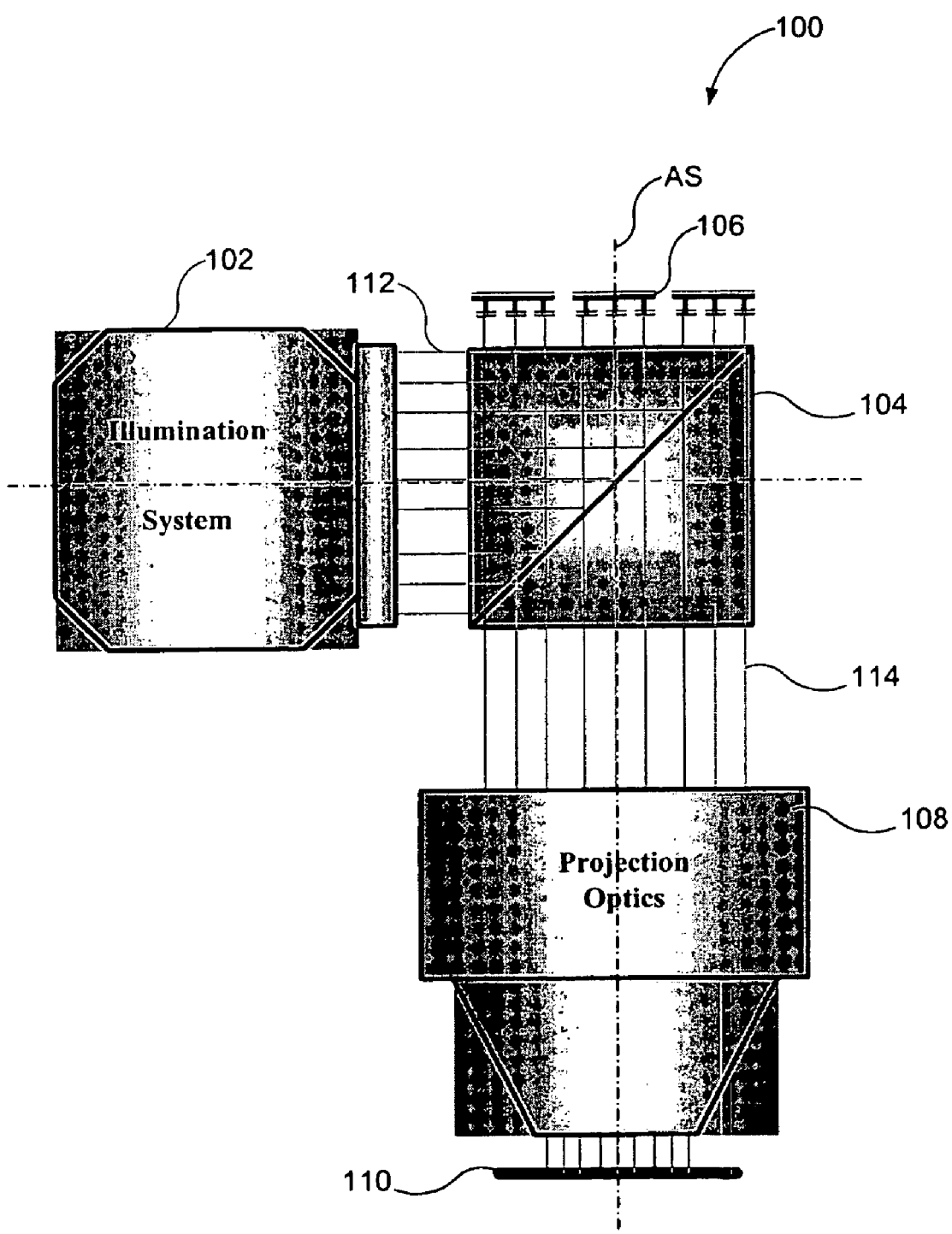
FIG. 1 shows an exemplary lithography system using double telecentric illumination.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provide a system and method that are used to pattern illumination to form one or more devices on a substrate using a reflecting system, a pattern generator that defines an objection plane, a projection system, and the substrate that defines an image plane. A reflecting portion of the reflecting system is substantially parallel to a reflecting portion of the pattern generator in a default state. The reflecting portion of the pattern generator patterns the illumination beam and directs the patterned illumination beam towards the substrate via the projection system. Based on the relationship of the reflecting system and the pattern generator, the illumination beam is telecentric proximate the object plane and the patterned illumination beam is telecentric proximate the image plane. Through use of a reflecting optic and not a transmissive optic to direct light between the illuminator and the projection system, illumination efficiency is increased and errors imparted on the illumination are decreased.

Terminology

Throughout the description, the use of the terms "pattern generator" and "pattern generating devices" includes a reflective and transmissive reticle, mask, contrast device, liquid crystal display, spatial light modulator, grating light valve, digital mirror device, or any other device that can be used to impart a pattern onto a light beam, as will become apparent to one or ordinary skill in the art upon reading this description.

Also, the use of "system" or "lithography system" is meant to include photolithography, direct write lithography, maskless lithography, immersion lithography, and the like.

The use of "light" or "radiation" is meant to include any wavelength desired for a particular application.

The use of "telecentric" describes a special property of certain designed in which chief rays for all points across an object space or image space are collimated. For example, telecentricity occurs when the chief rays are substantially parallel to an optical axis, e.g., an axis AS of a pattern generator (e.g., a pattern generator 206 shown in FIGS. 2–4 or a pattern generator 506 shown in FIGS. 5–6) and an axis of symmetry AS of a reflecting system (e.g., a reflecting system 216/216' shown in FIGS. 2–4 or a reflecting system 516 shown in FIGS. 5–6). in object and/or image space. Another way of describing telecentricity is to state that the entrance pupil and/or exit pupil of the system is located at infinity.

The use of "parallel" and/or "substantially parallel" is meant to include as much variation with respect to parallel as a specific application or system is designed to tolerate. Thus, this term is meant to include variations defined by requirements of system necessary to form a pattern with a pattern generator.

Overview of Environment for a Lithography

As discussed above, during lithography, a substrate, which is disposed on a substrate stage, is exposed to an image (e.g., a pattern) formed by a pattern generator, or an array thereof. The image is projected onto the substrate by projection optics located within a lithography apparatus. While projection optics are used in the case of lithography, a different type of exposure apparatus can be used depending on the particular application. For example, an excimer laser, x-ray, ion, electron, or photon lithography can each require a different exposure apparatus, as is known to those skilled in the art. The particular example of lithography is discussed here for illustrative purposes only.

Pattern generators are used in lithography systems to pattern light, which forms images that are used to form features on a substrate. Such substrates can include those used in the manufacture of flat panel displays (e.g., liquid crystal displays), circuit boards, various integrated circuits, and the like. A frequently used substrate for such applications is a semiconductor wafer or flat panel display glass substrate. While a portion this description is written in terms of a semiconductor wafer for illustrative purposes, one skilled in the art would recognize that this description also applies to other types of substrates known to those skilled in the art. Typically, reticles (or masks), spatial light modulators (SLMs) or contrast devices (hereinafter, both are referred to as SLMs), such as digital mirror devices (DMDs), liquid crystal displays (LCDs), grating light valves (GLVs), or the like, or any other elements that include a transmissive and/or reflective pattern can be used as pattern generators.

A pattern generator can include an active area having an n×m (wherein n and m are integers greater than 1) array of active devices (or pixels). For example, active areas can include, but are not limited to, an array of mirrors on a DMD, an array of gratings on a GLV, or an array of reflective/transmissive devices on the LCD. Each active device is individually controlled to move the active devices between ON and OFF through one or more discrete states. For example, if the active devices are mirrors on the DMD, each of the mirrors is individually controlled to rotate or tilt the mirror to either binary or multiple positions. As another example, if the active devices are strips in a GLV, sets of strips can be bent or straightened to allow reflection or diffraction of incoming light beams.

It is to be appreciated that controlling the active devices in the active areas so that they are partially or fully ON or OFF is well known in the art, and not fully described here for brevity. Typically, a predetermined and previously stored algorithm based on a desired exposure pattern is used to turn ON (or partially ON) and OFF the active devices, as is known in the relevant arts.

The projected image produces changes in the characteristics of a layer (e.g., photoresist) deposited on a surface of the substrate. These changes correspond to features in the image projected onto the substrate during exposure. Subsequent to exposure, the surface can be etched to produce a patterned layer. The pattern corresponds to the features projected onto the substrate during exposure. This patterned layer is then used to remove or further process exposed portions of underlying structural layers within the substrate, such as conductive, semiconductive, or insulative layers. This process is then repeated, together with other steps, until the desired features have been formed on the surface, or in various layers, of the substrate.

Step-and-scan technology works in conjunction with a projection optics system that has a narrow imaging slit. Rather than expose the entire substrate at one time with the image formed by the pattern generator, individual fields are scanned onto the substrate one at a time through an imaging slit. This is accomplished by moving the substrate and controlling active devices on the pattern generator, such that the imaging slot is moved across the field during the scan. The substrate stage is then stepped between field exposures to allow multiple copies of the pattern formed by the active devices on the pattern generator to be exposed over the substrate layer. In this manner, the quality of the image projected onto the substrate is maximized.

Systems Using Transmissive Optics to Produce Double Telecentric Beams

FIG. 1 shows an exemplary lithography system 100 using double telecentric illumination. System 100 includes an illumination system 102, a beam splitter 104, a pattern generator 106, a projection system 108, and a substrate 110. Other system elements are omitted to simplify the figure and subsequent description (e.g., a substrate stage, illumination source, etc.).

An illuminating light beam 112 (from an illumination source, not shown) is directed by beam splitter 104 towards pattern generator 106. Through reflection with pattern generator 106, light beam 114 is patterned by pattern generator 106 and passes through beam splitter 104 before being directed, using projection system 108, onto substrate 110.

In this embodiment, an object plane is defined by pattern generator 106 and an image plane is defined by substrate 110. A first chief ray (not shown) of beam 112 is telecentric proximate the object plane and a second chief ray (not shown) of beam 114 is telecentric proximate the image plane, and on input and exit from projection system 108, such that system 100 has double telecentric illumination.

In this embodiment, illumination beams 112 and 114 are absorbed during both passes through beam splitter 104, which dramatically reduces an illumination efficiency. Also, beam splitter 104 can impart errors in illumination beams 112 and 114, such as polarization changes, birefringence, aberrations, distortions, and the like.

Systems Using Reflecting Optics to Produce Double Telecentric Beams

Figure 2:
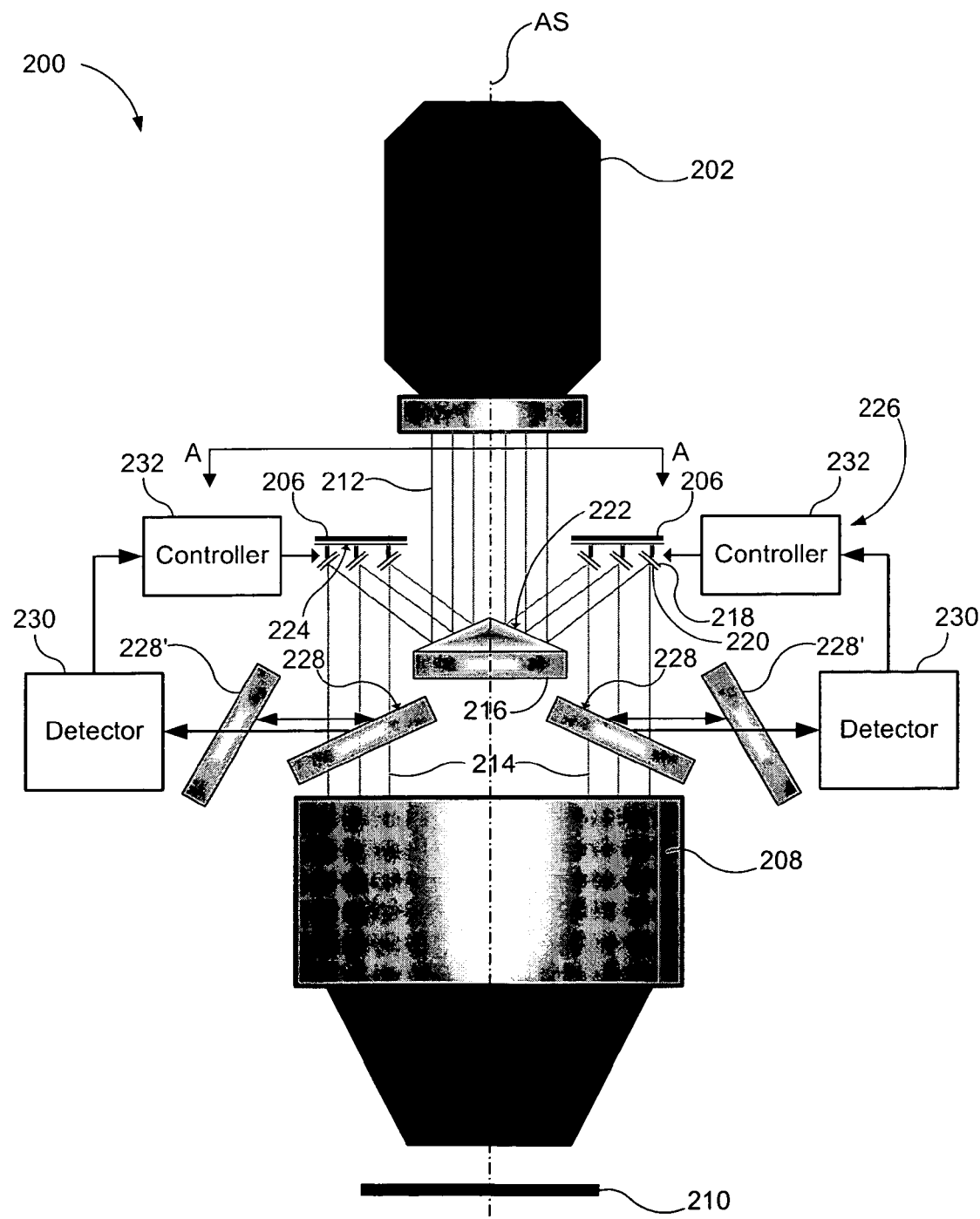
FIG. 2 shows a lithography system using double telecentric illumination, according to one embodiment of the present invention.
Figure 5:
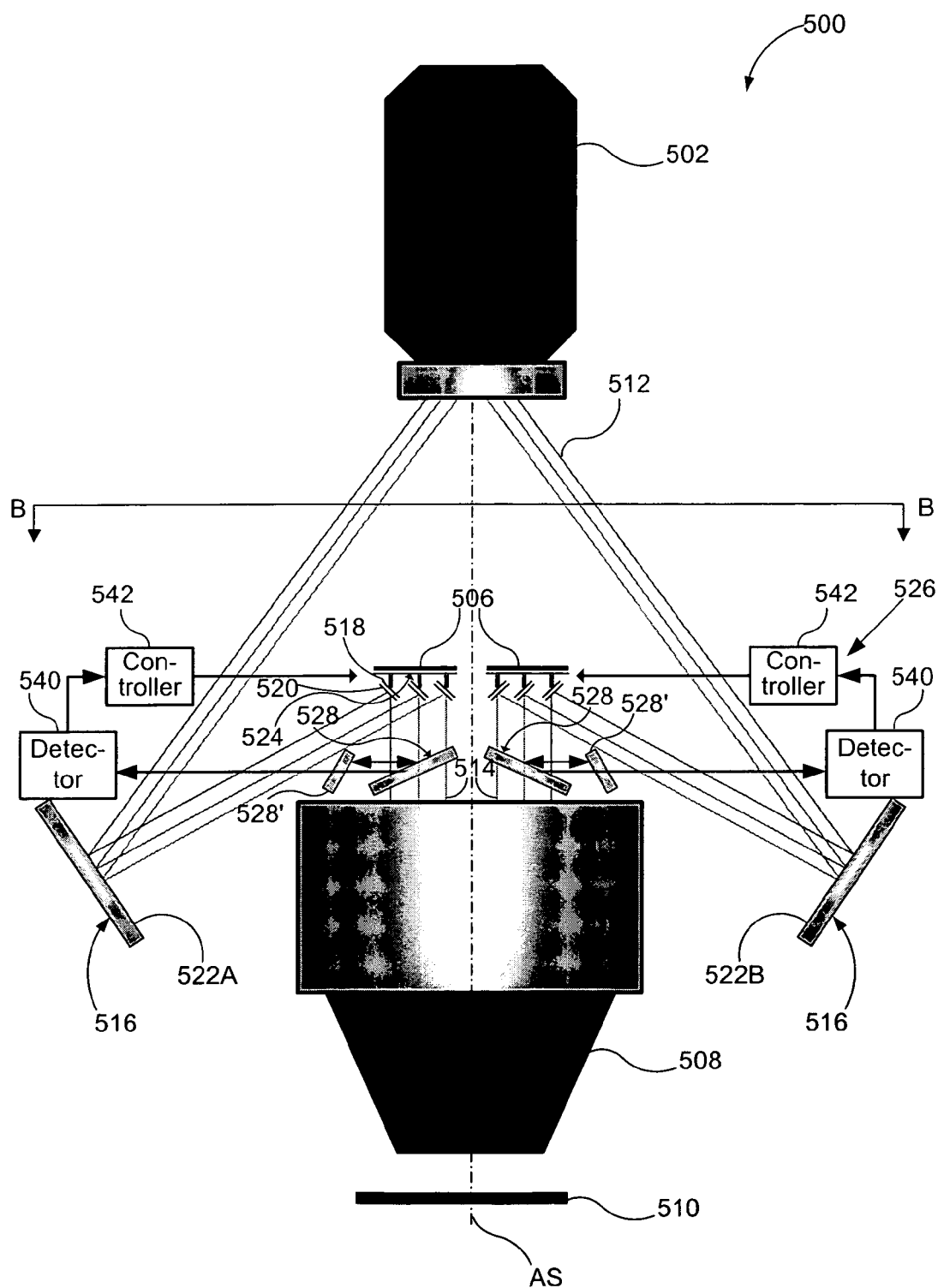
FIG. 5 shows a lithography system using double telecentric illumination, according to one embodiment of the present invention.

FIGS. 2 and 5 show lithography systems 200 and 500, respectively, using double telecentric illumination, according to two embodiments of the present invention. These systems eliminate or substantially reduce absorption and errors imparted on the illumination bean through use of a reflecting system 216/516 instead of a transmissive optic to direct light from an illumination system 202/502 towards a pattern generator 206/506.

With reference to FIG. 2, in system 200, light from illumination system 202 is reflected from reflecting system 216 towards pattern generator 206. This reflection is considered to be outwardly and/or through a central opening of an object plane. In one example, the object plane is defined by a plane passing through a longitudinal axis of pattern generator 206, or a plane parallel to such a plane. Pattern generator 206 includes a plurality of controllable elements 218, which each have a reflecting surface 220. In one example, elements 218 are active areas of pattern generator 206, and are controlled using electrostatic actuation, or the like, as described above and known to those skilled in the art. Similar to what is discussed above with reference to FIG. 1, a patterned beam 214 is projected using a projection system 208 onto a substrate 210.

In one example, illumination system 202 includes a light source (not shown) and illumination optics (not shown). In another example, illumination system 202 includes only illumination optics, and a light beam is delivered to illumination system 202 from a remote light source.

When properly aligned, reflecting surfaces 220 are substantially parallel with a reflection portion 222 of reflecting system 216. In one example, a tilted position, in which reflecting surfaces 220 are angled with respect to pattern generator 206, may be a default position of elements 218. For example, reflecting surfaces 220 are tilted about 2–3 degrees. In one example, proper alignment of reflecting surfaces 220 with respect to reflecting portion 222 can be accomplished through an initial, and possibly intermittent, calibration. The calibration can be accomplished through a calibration process, as would become apparent to one of ordinary skill in the art based on the teachings herein. Calibration may also be needed to correct for defects or warping of elements 218 or reflecting surfaces 220.

In one example, a calibration system 226 includes one or more moveable (retractable) beam splitters 228 that move into (position 228) and out of (position 228') a light path of one or more reflected beams 214. When in the light path, a portion of beams 214 is directed onto one or more detectors or sensors 230, which generate a control signal that is forward to one or more controllers 232. Controllers 232 generate a control signal that controls each individual element 218 in pattern generator 206. Other now known or developed control systems and processes are also contemplated within the scope of the present invention.

In one example, in order to further increase illumination efficiency, illumination system 202 contains optical elements that allow for a desired light distribution in beam 212. This can include shaping and/or directing of illumination beam 212 using an optical device (not shown), for example a diffractive optical device. Use of shaping and directing elements (not shown) allows substantially all of illumination beam 212 to interact only with elements 218 of pattern generator 206, and be directed away from inactive areas 224 of pattern generator 206. An example shaping and directing system is taught in U.S. application Ser. No. 10/808,436 ("the '436 application"), filed Mar. 25, 2004, to Coston et al., which is commonly owned by the assignee and is incorporated herein by reference in its entirety.

Figure 3:
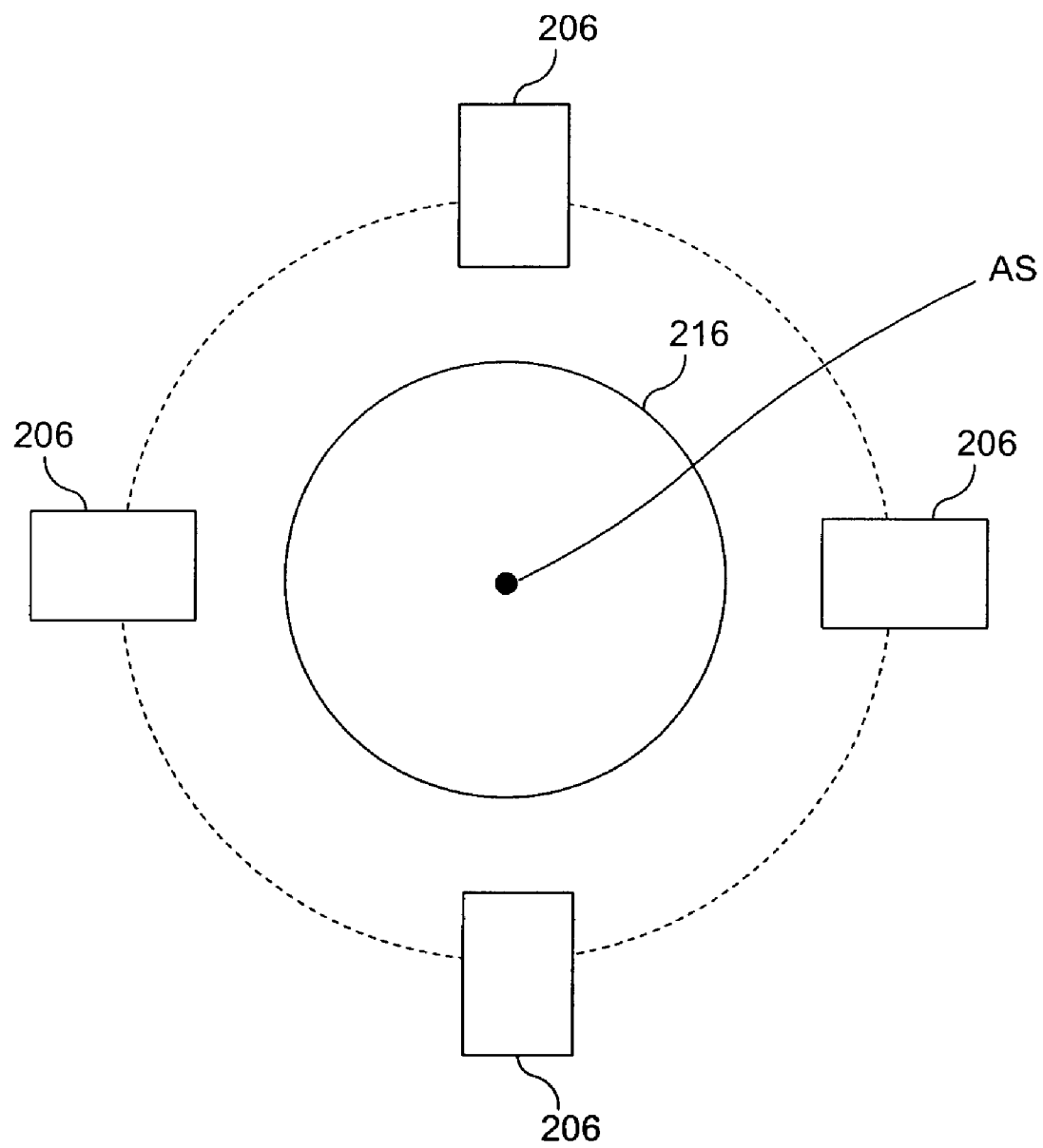
FIGS. 3–4 show a portion of the system in FIG. 2 looking into line A—A, according to various embodiments of the present invention.
Figure 4:
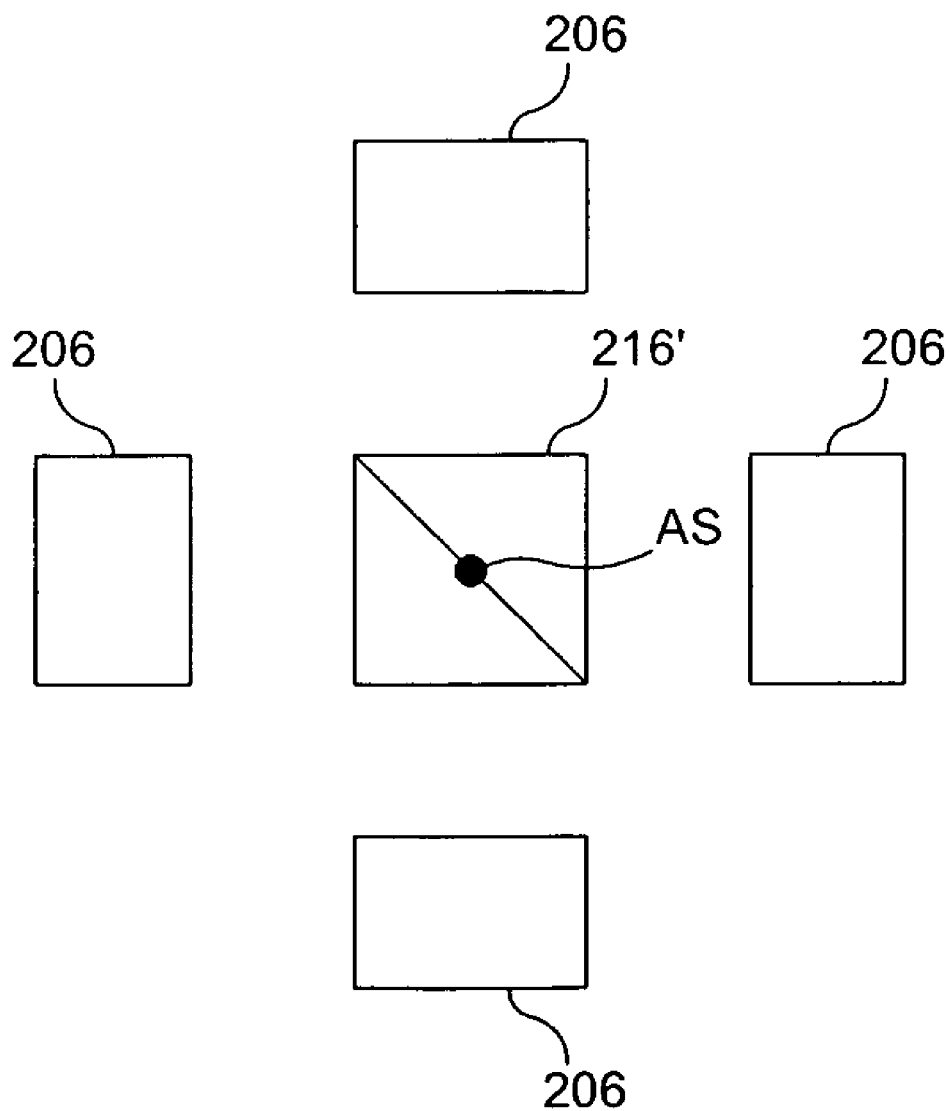

FIGS. 3–4 show a portion of the system in FIG. 2 looking into line A—A, according to various embodiments of the present invention.

In the example shown in FIG. 3, a conical reflecting system 216 is shown with one or more pattern generators 206 surrounding it. It is to be appreciated that, although four pattern generators 206 are shown, any number can be used based on a desired operation of system 200.

In the example shown in FIG. 4, a pyramid shaped reflecting system 216' is shown having one pattern generator 206 for each side of the pyramid.

FIGS. 3 and 4 are meant to be exemplary, and not exhaustive, as to the shape of reflecting system 216 and number of pattern generators 206 that can be used in system 200.

Turning now to FIG. 5, in system 500, light from illumination system 502 is reflected from reflecting system 516 towards pattern generator 506. This reflection is considered to be inwardly and/or through a peripheral opening of an object plane. In one example, the object plane is defined by a plane passing through a longitudinal axis of pattern generator 506, or a plane parallel to such a plane. Pattern generator 506 includes a plurality of controllable elements 518, which each have a reflecting surface 520. In one example, elements 518 are active areas of pattern generator 506, and are controlled using electrostatic actuation, or the like, as described above and known to those skilled in the art. Similar to what is discussed above with reference to FIG. 1. a patterned beam 514 is projected using a projection system 508 onto a substrate 510.

In one example, illumination system 502 includes a light source (not shown) and illumination optics (not shown). In another example, illumination system 502 include only illumination optics, and a light beam is delivered to illumination system 502 from a remote light source.

When properly aligned, reflecting surfaces 520 are substantially parallel with a first and second reflection portions 522A and 522B, respectively, of reflecting system 516. In one example, a tilted position, in which reflecting surfaces 520 are angle with respect to pattern generator 506, may be a default position of elements 518. For example, reflecting surfaces 520 are tilted about 2–4 degrees. In one example, proper alignment of reflecting surfaces 520 with respect to reflecting portions 522A and 522B can be accomplished through an initial, and possibly intermittent, calibration. The calibration can be accomplished through a calibration process, as would become apparent to one of ordinary skill in the art based on the teachings herein. Calibration may also be needed to correct for defects or warping of elements 518 or reflecting surfaces 520.

In one example, a calibration system 526 includes one or more moveable (retractable) beam splitters 528 that move into (position 528) and out of (position 528') a light path of one or more reflected beams 514. When in the light path, a portion of beams 514 is directed onto one or more detectors or sensors 540, which generate a control signal that is provided to one or more controllers 542. Controllers 542 generate a control signal that controls each individual element 518 in pattern generator 506. Other now known or developed control systems and processes are also contemplated within the scope of the present invention.

In one example, in order to further increase illumination efficiency, illumination system 502 contains optical elements that allow for a desired light distribution in beam 512. This can include shaping and/or directing of illumination beam 512 using an optical device (not shown), for example a diffractive optical device. Use of shaping and directing elements (not shown) allows substantially all of illumination beam 512 to interacts only with elements 518 of pattern generator 506, and be directed away from inactive areas 524 of pattern generator 506. An example shaping and directing system is taught in the '436 application discussed above.

Figure 6:
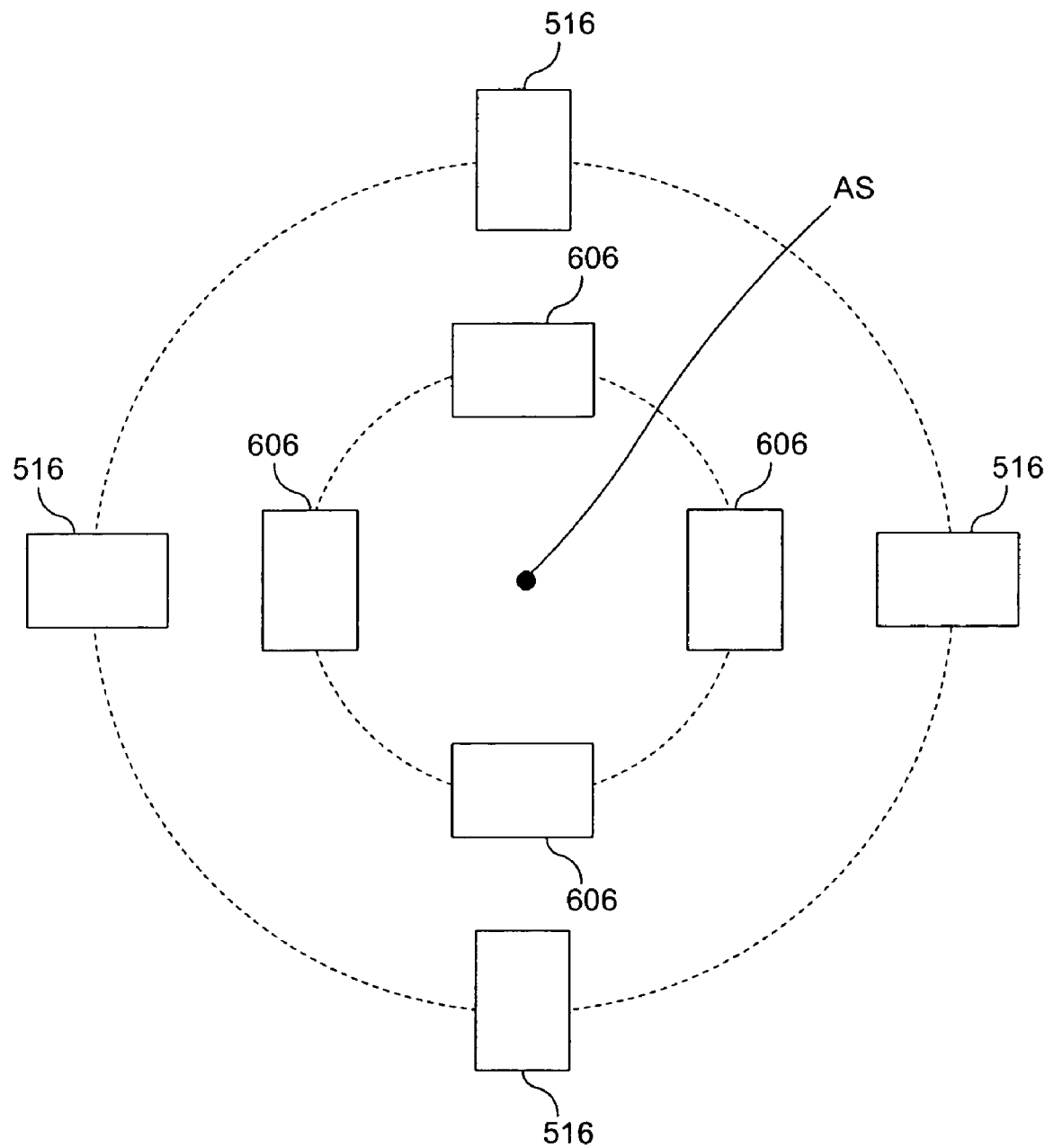
FIG. 6 shows a portion of the system in FIG. 5 looking into line B—B, according to one embodiment of the present invention.

FIG. 6 shows a portion of the system in FIG. 5 looking into line B—B, according to one embodiment of the present invention. In the example shown in FIG. 6, reflecting system 516 can be any number of components, although only four components are shown for convenience. Similarly, any number of pattern generators 606 can be used, which can correspond to a number of components in reflecting system 516.

Figure 7:
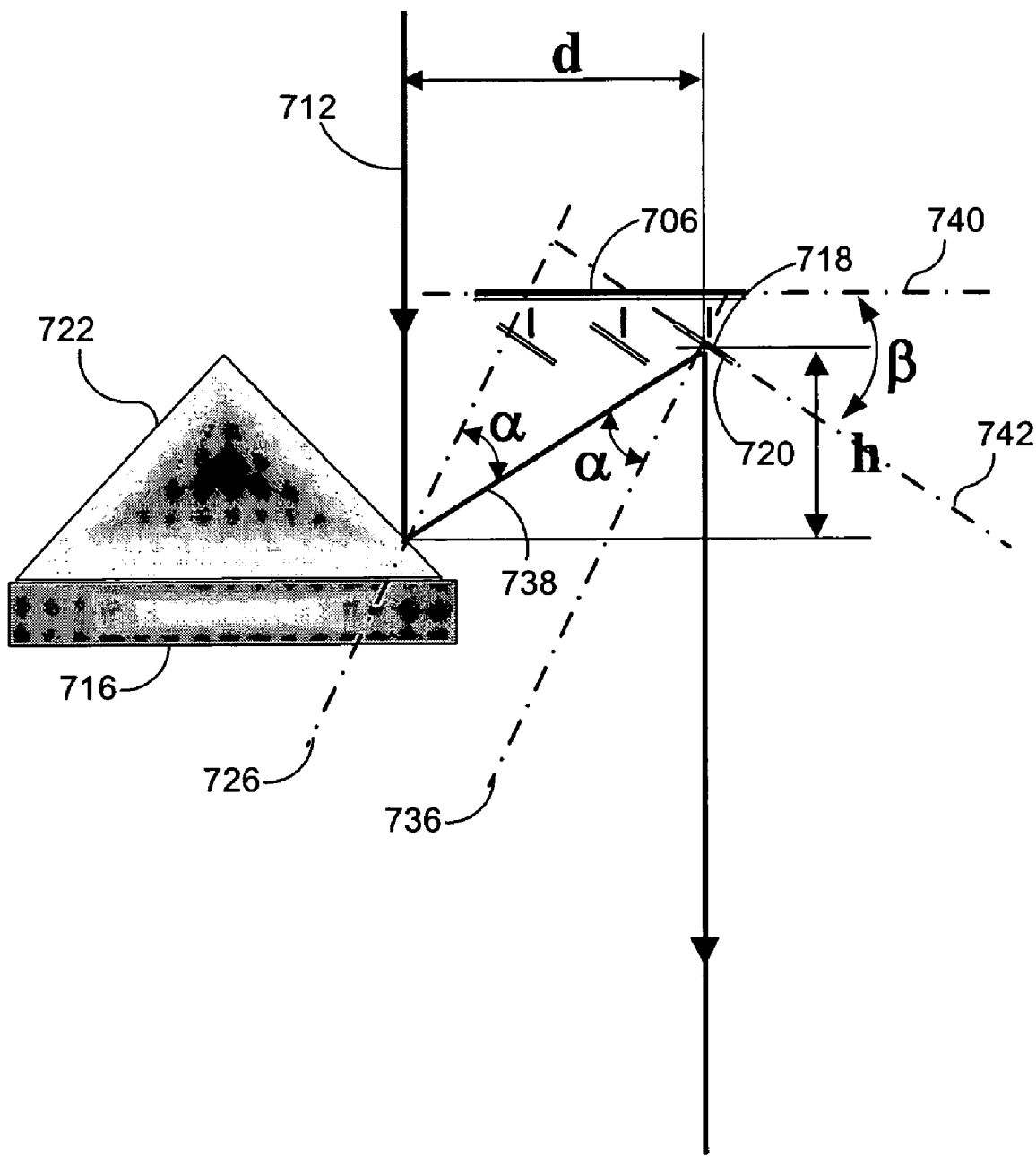
FIG. 7 shows a relationship between a reflecting system and a pattern generator, according to one embodiment of the present invention.

FIG. 7 shows a relationship between a reflecting system 716 and a pattern generator 706, according to one embodiment of the present invention. A tilt angle β is an angle between axis 740, which is a longitudinal axis of pattern generator 706, and axis 742, which is a longitudinal axis of element 718. A desired tilt angle β is achieved through use of the following formula:

$$(d/h) = \tan 2\alpha$$

In this formula: d is a horizontal distance between a point where beam 712 reflects from reflecting portion 722 of reflecting system 716 and a point where a reflected beam 734 reflects and is patterned by reflecting surface 720 of element 718; h is a vertical distance between these two points; and α is an angle between two axis 736 and 738 and/or axes 726 and 738 that intersect perpendicularly with respect to reflection portion 722 and reflecting surface 720, respectively. If a smaller tilt angle β is desired, d, h and/or α must be increased, while is a larger tilt angle β is desired, d, h and/or α must be decreased.

Exemplary Operation

Figure 8:
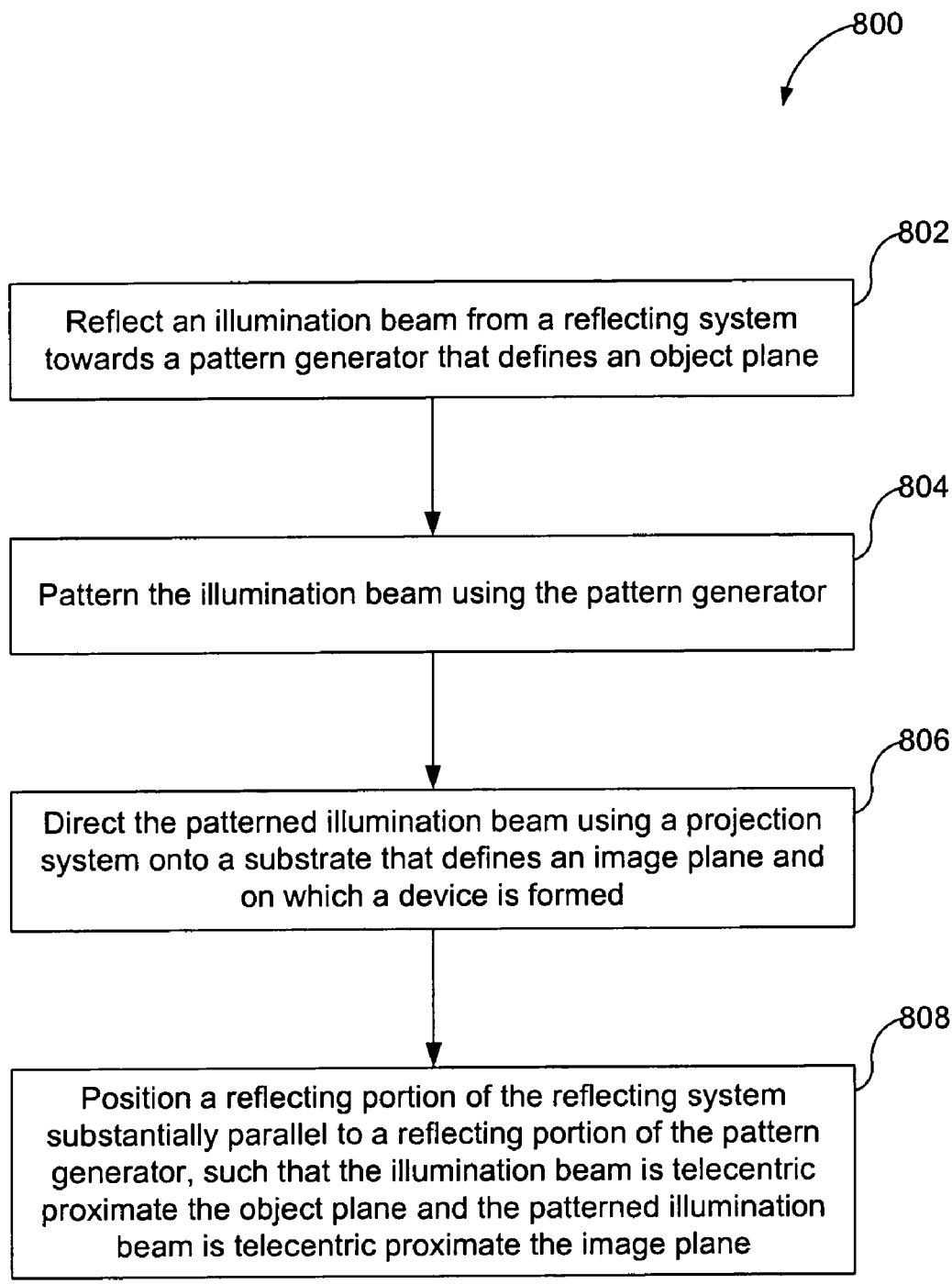
FIG. 8 is a flowchart depicting a method, according to one embodiment of the present invention.

FIG. 8 is a flowchart depicting a method 800, according to one embodiment of the present invention. In one example, method 800 is used to operate at least one of systems 200 or 500 describe above.

In step 802, an illumination beam is reflected from a reflecting system towards a pattern generator that defines an object plane. In step 804, the illumination beam is patterned using the pattern generator. In step 806, the patterned illumination beam is directed, using a projection system, onto a substrate that defines an image plane and on which the device is formed. In step 808, a reflecting portion of the reflecting system is positioned substantially parallel to a reflecting portion of the pattern generator. The reflecting portion of the pattern generator patterns the illumination beam and directs the patterned illumination beam to the substrate, such that the illumination beam is telecentric proximate the object plane and the patterned illumination beam is telecentric proximate the image plane.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising,
   an illumination system that generates a beam of radiation;
   a reflecting system including a reflecting portion;
   a pattern generator including a plurality of arrays of individually controllable elements that are symmetrical about an axis of symmetry of the pattern generator and an axis of symmetry of the reflecting system, each of the individually controllable elements having a reflecting surface, the pattern generator defining an object plane and configured to pattern the beam of radiation; and
   a projection system that projects the patterned beam onto a substrate,
   wherein the reflecting portion of the reflecting system reflects the beam of radiation outwardly or inwardly with respect to the axes onto the reflecting surfaces of selected ones of the individually controllable elements.

2. The system of claim 1, further comprising:
a calibration system that is configured to generate control signals to move the individually controllable elements to respective default positions based on detecting the patterned beam.

3. The system of claim 1, wherein the beam of radiation is formed such that substantially all of the beam of radiation interacts with the pattern generator.

4. The system of claim 1, wherein the reflecting portion of the reflecting system is substantially parallel to the reflecting surfaces of the individually controllable elements when they are in a default state.

5. The system of claim 1, wherein the beam of radiation is telecentric proximate the object plane and the patterned beam is telecentric proximate the image plane.

6. A lithography system, comprising:
an illuminating system that produces a beam of radiation;
a dynamic pattern generator having an array of individually controllable elements, the individually controllable elements being symmetrical about an axis of symmetry of the pattern generator and an axis of symmetry of a reflector, the pattern generator patterning the beam of radiation;
the reflector having a conical reflecting surface that is substantially parallel to respective reflecting surfaces of each of the individually controllable elements when the individually controllable elements are in a default state; and
a projection system that directs the patterned beam onto a substrate,
wherein the beam of radiation is telecentric proximate an object plane and the patterned beam is telecentric proximate an image plane.

7. The lithography system of claim 6, wherein the reflector directs the beam of radiation outwardly towards the array of individually controllable elements.

8. The lithography system of claim 6, further comprising:
a calibration system that detects the patterned beam and generates a control signal therefrom that is used to position each of the individually controllable elements such that they are substantially parallel in the default state to the conical reflecting surface.

9. A lithography system, comprising:
an illuminating system that produces a beam of radiation;
a dynamic pattern generator having an array of individually controllable elements that patterns the beam of radiation the individually controllable elements being symmetrical about an axis of symmetry of the pattern generator and an axis of symmetry of a reflector;
the reflector having a pyramid shaped reflecting surface that is substantially parallel to respective reflecting surfaces of each of the individually controllable elements when the individually controllable elements are in a default state; and
a projection system that directs the patterned beam onto a substrate,
wherein the beam of radiation is telecentric proximate an object plane and the patterned beam is telecentric proximate an image plane.

10. The lithography system of claim 9, wherein the reflector directs the beam of radiation outwardly towards the array of individually controllable elements.

11. The lithography system of claim 9, further comprising:
a calibration system that detects the patterned beam and generates a control signal that is used to position each of the individually controllable elements such that they are substantially parallel in the default state to the pyramid shaped reflecting surface.

12. A lithography system, comprising:
an illuminating system that produces an illumination beam;
a plurality of dynamic pattern generators each having a plurality of reflective controllable elements that pattern the illumination beam the reflective controllable elements being symmetrical about an axis of symmetry of the pattern generators and an axis of symmetry of a reflector;
the reflector whose respective reflecting sections are substantially parallel to reflecting surfaces of the plurality of reflective controllable elements in a default state; and
a projection system that directs the patterned illumination beam onto a substrate,
wherein the illumination beam is telecentric proximate an object plane and the patterned illumination beam is telecentric proximate an image plane, and
wherein the reflector reflects the beam of radiation passing through a peripheral portion of the object plane onto the plurality of dynamic pattern generators.

13. The lithography system of claim 12, wherein the reflector reflects the illumination beam inwardly towards the dynamic pattern generator.

14. The lithography system of claim 12, further comprising:
a calibration system that positions elements in the plurality of controllable elements such that they are substantially parallel in the default state to the reflector.

15. A method of making a device, comprising:
(a) reflecting a beam of radiation using a reflecting section of a reflecting system towards a pattern generator that defines an object plane;
(b) patterning the beam of radiation using the pattern generator that includes a plurality of arrays of individually controllable elements that are symmetrical about an axis of symmetry of the pattern generator and an axis of symmetry of the reflecting system, each of the individually controllable elements having a reflective surface;
(c) directing the patterned beam using a projection system onto a substrate that defines an image plane and on which the device is formed,
wherein the reflecting section reflects the beam of radiation outwardly or inwardly with respect to the axes towards the pattern generator.

16. The method of claim 15, wherein step (b) comprises:
adjusting the reflective surfaces of the individually controllable elements to a default state so that the reflecting surfaces are substantially parallel to the reflecting section of the reflecting system.

17. The method of claim 16, further comprising:
(e) using a calibration method to position respective ones of the plurality of individually controllable elements.

18. The method of claim 15, wherein step (a) comprises:
forming the beam of radiation such that substantially all of the beam of radiation interacts with the pattern generator.

19. The method of claim 15, wherein the beam of radiation is telecentric proximate the object plane and the patterned beam is telecentric proximate the image plane.

* * * * *